United States Patent
Nicholls et al.

(10) Patent No.: US 9,721,872 B1
(45) Date of Patent: Aug. 1, 2017

(54) METHODS AND STRUCTURES FOR INCREASING THE ALLOWABLE DIE SIZE IN TMV PACKAGES

(75) Inventors: Louis W. Nicholls, Gilbert, AZ (US); Roger D. St. Amand, Tempe, AZ (US); Jin Seong Kim, Seoul (KR); Woon Kab Jung, Seoul (KR); Sung Jin Yang, Seoul (KR); Robert F. Darveaux, Gilbert, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 13/398,646

(22) Filed: Feb. 16, 2012

Related U.S. Application Data

(60) Provisional application No. 61/444,306, filed on Feb. 18, 2011.

(51) Int. Cl.
*H01L 23/498* (2006.01)
*H01L 21/56* (2006.01)
*H01L 23/48* (2006.01)

(52) U.S. Cl.
CPC .................................. *H01L 23/48* (2013.01)

(58) Field of Classification Search
CPC ............... H01L 23/4952; H01L 25/065; H01L 2224/78301; H01L 2224/45144; H01L 2224/48464; H01L 2224/48247; H01L 2224/16145; H01L 24/78; H01L 23/49; H01L 24/48; H01L 24/16; H01L 24/45; H01L 2224/16225; H01L 2224/45015;
(Continued)

(56) References Cited

U.S. PATENT DOCUMENTS 3,462,349 A * 8/1969 Gorgenyi ..................... 205/122
3,868,724 A 2/1975 Perrino
(Continued)

FOREIGN PATENT DOCUMENTS

| JP | 05-109975 | 4/1993 |
|---|---|---|
| JP | 05-136323 | 6/1993 |

(Continued)

OTHER PUBLICATIONS

Darveaux et al., "Flex Circuit Package and Method," U.S. Appl. No. 12/692,397, filed Jan. 22, 2010.
(Continued)

*Primary Examiner* — Alexander Oscar Williams
(74) *Attorney, Agent, or Firm* — McAndrews, Held & Malloy, Ltd.

(57) ABSTRACT

A package includes a substrate having an electronic component flip chip mounted thereto by flip chip bumps. The electronic component includes an active surface and an inactive surface. Electrically conductive columns (TSV) extend through the electronic component between the active surface and the inactive surface. A RDL structure is coupled to the inactive surface, the RDL structure redistributing the pattern of the electrically conductive columns at the inactive surface to a pattern of inactive surface RDL lands. The inactive surface RDL lands are exposed through via apertures of a package body. By using the inactive surface of the electronic component to distribute the inactive surface RDL lands, the allowable size of the electronic component is maximized.

21 Claims, 12 Drawing Sheets

(58) Field of Classification Search
CPC . H01L 2224/45124; H01L 2224/45147; H01L 2224/45644
USPC ........ 257/777.778, 734, 737, 738, 774, 773, 257/780, 783, 784, 786, E31.124, E23, 257/11, E25.032, E23.141, E25.013
See application file for complete search history.

(56) References Cited

U.S. PATENT DOCUMENTS

| | | | |
|---|---|---|---|
| 3,916,434 A | 10/1975 | Garboushian | |
| 4,322,778 A | 3/1982 | Barbour et al. | |
| 4,532,419 A | 7/1985 | Takeda | |
| 4,642,160 A | 2/1987 | Burgess | |
| 4,645,552 A | 2/1987 | Vitriol et al. | |
| 4,685,033 A | 8/1987 | Inoue | |
| 4,706,167 A | 11/1987 | Sullivan | |
| 4,716,049 A | 12/1987 | Patraw | |
| 4,786,952 A | 11/1988 | Maciver et al. | |
| 4,806,188 A | 2/1989 | Rellick | |
| 4,811,082 A | 3/1989 | Jacobs et al. | |
| 4,897,338 A | 1/1990 | Spicciati et al. | |
| 4,905,124 A | 2/1990 | Banjo et al. | |
| 4,964,212 A | 10/1990 | Deroux-Dauphin et al. | |
| 4,974,120 A | 11/1990 | Kodai et al. | |
| 4,996,391 A | 2/1991 | Schmidt | |
| 5,021,047 A | 6/1991 | Movern | |
| 5,072,075 A | 12/1991 | Lee et al. | |
| 5,072,520 A | 12/1991 | Nelson | |
| 5,081,520 A | 1/1992 | Yoshii et al. | |
| 5,091,769 A | 2/1992 | Eichelberger | |
| 5,108,553 A | 4/1992 | Foster et al. | |
| 5,110,664 A | 5/1992 | Nakanishi et al. | |
| 5,191,174 A | 3/1993 | Chang et al. | |
| 5,229,550 A | 7/1993 | Bindra et al. | |
| 5,239,448 A | 8/1993 | Perkins et al. | |
| 5,247,429 A | 9/1993 | Iwase et al. | |
| 5,250,843 A | 10/1993 | Eichelberger | |
| 5,278,726 A | 1/1994 | Bernardoni et al. | |
| 5,283,459 A | 2/1994 | Hirano et al. | |
| 5,353,498 A | 10/1994 | Fillion et al. | |
| 5,371,654 A | 12/1994 | Beaman et al. | |
| 5,379,191 A | 1/1995 | Carey et al. | |
| 5,404,044 A | 4/1995 | Booth et al. | |
| 5,463,253 A | 10/1995 | Waki et al. | |
| 5,474,957 A | 12/1995 | Urushima | |
| 5,474,958 A | 12/1995 | Ojennas et al. | |
| 5,497,033 A | 3/1996 | Fillion et al. | |
| 5,508,938 A | 4/1996 | Wheeler | |
| 5,530,288 A | 6/1996 | Stone | |
| 5,531,020 A | 7/1996 | Durand et al. | |
| 5,546,654 A | 8/1996 | Wojnarowski et al. | |
| 5,574,309 A | 11/1996 | Papapietro et al. | |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,726,493 A | 3/1998 | Yamashita et al. | |
| 5,739,581 A | 4/1998 | Chillara | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,841,193 A | 11/1998 | Eichelberger | |
| 5,847,453 A | 12/1998 | Uematsu et al. | |
| 5,883,425 A | 3/1999 | Kobayashi | |
| 5,894,108 A | 4/1999 | Mostafazadeh et al. | |
| 5,903,052 A | 5/1999 | Chen et al. | |
| 5,907,477 A | 5/1999 | Tuttle et al. | |
| 5,936,843 A | 8/1999 | Ohshima et al. | |
| 5,952,611 A | 9/1999 | Eng et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,035,527 A | 3/2000 | Tamm | |
| 6,040,622 A | 3/2000 | Wallace | |
| 6,051,888 A | 4/2000 | Dahl | |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,119,338 A | 9/2000 | Wang et al. | |
| 6,122,171 A | 9/2000 | Akram et al. | |
| 6,127,833 A | 10/2000 | Wu et al. | |
| 6,133,072 A * | 10/2000 | Fjelstad ..................... 438/128 |
| 6,137,062 A | 10/2000 | Zimmerman | |
| 6,157,080 A * | 12/2000 | Tamaki et al. ............... 257/738 |
| 6,159,767 A | 12/2000 | Eichelberger | |
| 6,160,705 A | 12/2000 | Stearns et al. | |
| 6,172,419 B1 | 1/2001 | Kinsman | |
| 6,175,087 B1 | 1/2001 | Keesler et al. | |
| 6,184,463 B1 | 2/2001 | Pan chou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,294,408 B1 | 9/2001 | Edwards et al. | |
| 6,307,161 B1 | 10/2001 | Grube et al. | |
| 6,316,285 B1 | 11/2001 | Jiang et al. | |
| 6,329,609 B1 | 12/2001 | Kaja et al. | |
| 6,351,031 B1 | 2/2002 | Iijima et al. | |
| 6,353,999 B1 | 3/2002 | Cheng | |
| 6,365,975 B1 | 4/2002 | DiStefano et al. | |
| 6,376,906 B1 | 4/2002 | Asai et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,448,510 B1 | 9/2002 | Neftin et al. | |
| 6,451,509 B2 | 9/2002 | Keesler et al. | |
| 6,476,503 B1 * | 11/2002 | Imamura et al. ............. 257/780 |
| 6,479,762 B2 | 11/2002 | Kusaka | |
| 6,486,005 B1 | 11/2002 | Kim | |
| 6,486,554 B2 | 11/2002 | Johnson | |
| 6,497,943 B1 | 12/2002 | Jimarez et al. | |
| 6,517,995 B1 | 2/2003 | Jacobson et al. | |
| 6,534,391 B1 | 3/2003 | Huemoeller et al. | |
| 6,544,638 B2 | 4/2003 | Fischer et al. | |
| 6,573,598 B2 | 6/2003 | Ohuchi et al. | |
| 6,586,682 B2 | 7/2003 | Strandberg | |
| 6,608,382 B2 * | 8/2003 | Liu et al. ..................... 257/737 |
| 6,608,757 B1 | 8/2003 | Bhatt et al. | |
| 6,660,559 B1 | 12/2003 | Huemoeller et al. | |
| 6,715,204 B1 | 4/2004 | Tsukada et al. | |
| 6,727,576 B2 | 4/2004 | Hedler | |
| 6,727,645 B2 | 4/2004 | Tsujimura et al. | |
| 6,730,857 B2 | 5/2004 | Konrad et al. | |
| 6,734,542 B2 | 5/2004 | Nakatani et al. | |
| 6,740,964 B2 | 5/2004 | Sasaki | |
| 6,753,612 B2 | 6/2004 | Adae-Amoakoh et al. | |
| 6,765,287 B1 * | 7/2004 | Lin ........................... 257/686 |
| 6,774,748 B1 | 8/2004 | Ito et al. | |
| 6,787,443 B1 | 9/2004 | Boggs et al. | |
| 6,803,528 B1 | 10/2004 | Koyanagi | |
| 6,815,709 B2 | 11/2004 | Clothier et al. | |
| 6,815,739 B2 | 11/2004 | Huff et al. | |
| 6,838,776 B2 | 1/2005 | Leal et al. | |
| 6,845,554 B2 | 1/2005 | Frankowsky et al. | |
| 6,888,240 B2 | 5/2005 | Towle et al. | |

(56) References Cited

U.S. PATENT DOCUMENTS

| | | |
|---|---|---|
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leale et al. |
| 6,931,726 B2 | 8/2005 | Boyko et al. |
| 6,943,436 B2 | 9/2005 | Radu et al. |
| 6,953,995 B2 | 10/2005 | Farnworth et al. |
| 6,967,403 B2 | 11/2005 | Chuang et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,112,882 B2 | 9/2006 | Lee |
| 7,119,432 B2 | 10/2006 | Desai et al. |
| 7,125,744 B2 | 10/2006 | Takehara et al. |
| 7,185,426 B1 | 3/2007 | Hiner et al. |
| 7,192,807 B1 | 3/2007 | Huemoeller et al. |
| 7,196,408 B2 | 3/2007 | Yang et al. |
| 7,198,980 B2 | 4/2007 | Jiang et al. |
| 7,202,107 B2 | 4/2007 | Fuergut et al. |
| 7,215,026 B2 | 5/2007 | Park et al. |
| 7,238,602 B2 | 7/2007 | Yang |
| 7,242,081 B1* | 7/2007 | Lee ............................ 257/686 |
| 7,247,523 B1 | 7/2007 | Huemoeller et al. |
| 7,262,081 B2 | 8/2007 | Yang et al. |
| 7,262,082 B1* | 8/2007 | Lin et al. ...................... 438/109 |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,675,131 B2* | 3/2010 | Derderian ...................... 257/432 |
| 7,750,454 B2* | 7/2010 | Carson et al. .................. 257/686 |
| 7,777,351 B1 | 8/2010 | Berry et al. |
| 7,781,883 B2 | 8/2010 | Sri-Jayantha et al. |
| 7,825,520 B1 | 11/2010 | Longo et al. |
| 7,902,660 B1 | 3/2011 | Lee et al. |
| 7,928,562 B2 | 4/2011 | Arvelo et al. |
| 7,960,827 B1* | 6/2011 | Miller et al. ................... 257/712 |
| 7,982,298 B1* | 7/2011 | Kang et al. .................... 257/686 |
| 7,993,983 B1* | 8/2011 | Lin ................................. 438/127 |
| 8,008,770 B2 | 8/2011 | Lin et al. |
| 8,035,123 B2 | 10/2011 | Van et al. |
| 8,058,726 B1 | 11/2011 | Jin et al. |
| 8,067,268 B2* | 11/2011 | Carson et al. .................. 438/109 |
| 8,106,500 B2 | 1/2012 | Chow |
| 8,198,717 B1* | 6/2012 | Schenck et al. ............... 257/686 |
| 8,222,538 B1 | 7/2012 | Yoshida et al. |
| 8,258,015 B2* | 9/2012 | Chow et al. ................... 438/118 |
| 8,269,348 B2 | 9/2012 | Fazelpour |
| 8,288,201 B2 | 10/2012 | Pagaila |
| 8,341,835 B1 | 1/2013 | Huemoeller et al. |
| 8,471,154 B1* | 6/2013 | Yoshida et al. ................ 174/260 |
| 8,471,376 B1* | 6/2013 | Liou ................. H01L 23/49816 257/686 |
| 8,471,394 B2* | 6/2013 | Jang et al. ...................... 257/787 |
| 8,508,954 B2 | 8/2013 | Kwon et al. |
| 8,552,556 B1 | 10/2013 | Kim et al. |
| 8,624,374 B2 | 1/2014 | Ding et al. |
| 8,643,163 B2 | 2/2014 | Shim et al. |
| 8,759,147 B2* | 6/2014 | Choi et al. ..................... 438/106 |
| 8,773,866 B2* | 7/2014 | Jin et al. ........................ 361/783 |
| 8,829,678 B2 | 9/2014 | Lee et al. |
| 8,940,630 B2* | 1/2015 | Damberg et al. .............. 438/617 |
| 8,946,883 B2 | 2/2015 | Kim et al. |
| 8,981,550 B2 | 3/2015 | Park et al. |
| 9,012,789 B1 | 4/2015 | Yoshida et al. |
| 9,159,708 B2* | 10/2015 | Haba .................... H01L 21/561 |
| 2002/0011657 A1* | 1/2002 | Saito ............................. 257/700 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0135057 A1 | 9/2002 | Kurita |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0036183 A1 | 2/2004 | Im et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2004/0165362 A1 | 8/2004 | Farnworth |
| 2004/0262774 A1* | 12/2004 | Kang et al. .................... 257/777 |
| 2005/0056928 A1 | 3/2005 | Kwon et al. |
| 2005/0062154 A1 | 3/2005 | Duchesne et al. |
| 2005/0133928 A1 | 6/2005 | Howard et al. |
| 2005/0133932 A1* | 6/2005 | Pohl et al. ...................... 257/777 |
| 2005/0134507 A1* | 6/2005 | Dishongh et al. ...... 343/700 MS |
| 2005/0139985 A1 | 6/2005 | Takahashi |
| 2005/0242425 A1 | 11/2005 | Leal et al. |
| 2006/0192301 A1 | 8/2006 | Leal et al. |
| 2006/0208351 A1* | 9/2006 | Poo et al. ...................... 257/693 |
| 2006/0231958 A1 | 10/2006 | Yang |
| 2006/0258044 A1 | 11/2006 | Meyer et al. |
| 2007/0059866 A1 | 3/2007 | Yang et al. |
| 2007/0064395 A1 | 3/2007 | Chen et al. |
| 2007/0080757 A1* | 4/2007 | Yahata et al. ................. 333/133 |
| 2007/0132104 A1* | 6/2007 | Farnworth et al. ........... 257/774 |
| 2007/0220972 A1* | 9/2007 | Araki et al. ................ 73/504.12 |
| 2007/0254406 A1* | 11/2007 | Lee .................... H01L 25/0657 438/109 |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0182363 A1 | 7/2008 | Amrine et al. |
| 2008/0230887 A1 | 9/2008 | Sun et al. |
| 2008/0246133 A1* | 10/2008 | Derderian ...................... 257/678 |
| 2008/0290492 A1 | 11/2008 | Chung et al. |
| 2008/0290496 A1 | 11/2008 | Park |
| 2009/0026609 A1* | 1/2009 | Masuda ......................... 257/737 |
| 2009/0051025 A1 | 2/2009 | Yang et al. |
| 2009/0085205 A1* | 4/2009 | Sugizaki ........................ 257/737 |
| 2009/0236700 A1* | 9/2009 | Moriya .......................... 257/659 |
| 2009/0243073 A1* | 10/2009 | Carson et al. ................. 257/686 |
| 2009/0289343 A1* | 11/2009 | Chiu et al. ..................... 257/690 |
| 2009/0309206 A1* | 12/2009 | Kim et al. ...................... 257/686 |
| 2010/0007002 A1* | 1/2010 | Pendse ........................... 257/686 |
| 2010/0007032 A1* | 1/2010 | Gallegos ........................ 257/777 |
| 2010/0020503 A1 | 1/2010 | Beaumier et al. |
| 2010/0130000 A1 | 5/2010 | Sutou et al. |
| 2010/0140779 A1* | 6/2010 | Lin et al. ....................... 257/690 |
| 2010/0167451 A1* | 7/2010 | Derderian ........................ 438/64 |
| 2010/0181665 A1 | 7/2010 | Casey et al. |
| 2010/0208432 A1 | 8/2010 | Bhagwagar et al. |
| 2011/0062602 A1* | 3/2011 | Ahn et al. ...................... 257/787 |
| 2011/0068427 A1 | 3/2011 | Paek et al. |
| 2011/0068478 A1* | 3/2011 | Pagaila et al. ................. 257/774 |
| 2011/0084382 A1 | 4/2011 | Chen et al. |
| 2011/0204505 A1* | 8/2011 | Pagaila et al. ................. 257/686 |
| 2011/0227223 A1* | 9/2011 | Wu et al. ....................... 257/738 |
| 2011/0233782 A1 | 9/2011 | Chang et al. |
| 2012/0061855 A1* | 3/2012 | Do et al. ........................ 257/778 |
| 2012/0069683 A1* | 3/2012 | Kamata et al. ........... 365/185.25 |
| 2012/0094443 A1 | 4/2012 | Pratt et al. |
| 2012/0153453 A1 | 6/2012 | Ankireddi et al. |
| 2012/0168917 A1* | 7/2012 | Yim et al. ...................... 257/666 |
| 2012/0178218 A1* | 7/2012 | Bauer et al. ................... 438/126 |

(56) References Cited

U.S. PATENT DOCUMENTS

| | | | |
|---|---|---|---|
| 2012/0280386 A1* | 11/2012 | Sato | H01L 23/3121 257/737 |
| 2012/0326307 A1 | 12/2012 | Jeong et al. | |
| 2012/0326324 A1* | 12/2012 | Lee et al. | 257/774 |
| 2013/0017643 A1* | 1/2013 | Lin et al. | 438/51 |
| 2013/0037942 A1* | 2/2013 | Hwang et al. | 257/737 |
| 2013/0040427 A1* | 2/2013 | Hu et al. | 438/122 |
| 2013/0052775 A1 | 2/2013 | Kim et al. | |
| 2013/0062786 A1* | 3/2013 | Leung et al. | 257/782 |
| 2013/0075924 A1* | 3/2013 | Lin et al. | 257/774 |
| 2013/0078765 A1* | 3/2013 | Lin et al. | 438/107 |
| 2013/0078915 A1* | 3/2013 | Zhao et al. | 455/41.1 |
| 2013/0093088 A1* | 4/2013 | Chau | H01L 23/49517 257/738 |
| 2013/0134559 A1* | 5/2013 | Lin et al. | 257/620 |
| 2013/0214402 A1 | 8/2013 | Park et al. | |
| 2013/0241039 A1 | 9/2013 | Choi et al. | |
| 2013/0249042 A1* | 9/2013 | Shen et al. | 257/459 |
| 2013/0273698 A1* | 10/2013 | Shao | B29C 43/18 438/127 |
| 2013/0309814 A1 | 11/2013 | Too et al. | |
| 2013/0320517 A1 | 12/2013 | Shirley | |
| 2013/0328192 A1 | 12/2013 | Lee et al. | |
| 2014/0036454 A1* | 2/2014 | Caskey | H05K 1/0298 361/735 |
| 2014/0048906 A1* | 2/2014 | Shim et al. | 257/531 |
| 2014/0061893 A1 | 3/2014 | Saeidi et al. | |
| 2014/0077363 A1* | 3/2014 | Lin | H01L 22/14 257/737 |
| 2014/0077364 A1* | 3/2014 | Marimuthu | H01L 23/5389 257/737 |
| 2014/0077366 A1 | 3/2014 | Kim et al. | |
| 2014/0124949 A1 | 5/2014 | Paek | |
| 2014/0131856 A1 | 5/2014 | Do | |
| 2014/0138817 A1 | 5/2014 | Paek et al. | |
| 2014/0210109 A1* | 7/2014 | Tanaka et al. | 257/778 |
| 2015/0021791 A1 | 1/2015 | Park | |
| 2015/0348928 A1* | 12/2015 | Co | H01L 24/17 257/712 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |
| JP | 2001-118947 | 10/1999 |
| JP | 2005-333052 | 12/2005 |
| JP | 2006-073622 | 3/2006 |
| JP | 2007-043090 | 2/2007 |
| KR | 10-1997-005712 | 4/1997 |
| KR | 20-0412028 | 3/2006 |
| KR | 10-2006-0050579 | 5/2006 |
| KR | 10-0787894 | 12/2007 |
| KR | 10-2009-0100895 | 9/2009 |
| KR | 10-0990939 | 11/2010 |
| KR | 10-1056749 | 8/2011 |
| KR | 10-2012-0053332 | 5/2012 |
| KR | 10-1151258 | 6/2012 |
| KR | 10-2013-0092208 | 8/2013 |

OTHER PUBLICATIONS

Nicholls et al., "Methods and Structures for Increasing the Allowable Die Size in TMV Packages," U.S. Appl. No. 61/444,306, filed Feb. 18, 2011.

Office Action corresponding to Korean Patent Application No. 10-2012-0061321, 5 pages, Jun. 13, 2013.

Office Action corresponding to Korean Patent Application No. 10-2012-0015799, 4 pages, May 7, 2013.Office Action corresponding to Korean Patent Application No. 10-2012-0104330,4 pages, Nov. 5, 2013.

Office Action corresponding to Korean Patent Application No. 10-2012-0104330,4 pages, Nov. 5, 2013.

Office Action corresponding to Korean Patent Application No. 10-2013-0132666, 10 pages, Mar. 4, 2015.

Int'l Search Report and Written Opinion corresponding to PCT/US13/69057 dated Apr. 4, 2014 (10 pages).

CAD_CIM Requirements Article IMAPS, Sep./Oct. 1994.

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package", 58.sup.th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Lee et al., "Interposer, Manufacturing Method Thereof, Semiconductor Package Using the Same, and Method for Fabricating the Semiconductor Package", U.S. Appl. No. 14/532,532, Nov. 4, 2014.

Huemoeller et al., "Build Up Motherboard Fabrication Method and Structure", U.S. Appl. No. 11/824,395, filed Jun. 29, 2007.

Hiner et al., "Printed Wiring Motherboard Having Bonded Interconnect Redistribution Mesa", U.S. Appl. No. 10/992,371, filed Nov. 18, 2004.

\* cited by examiner

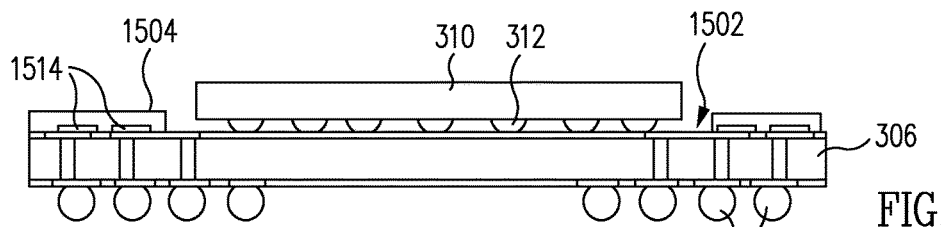
FIG. 15
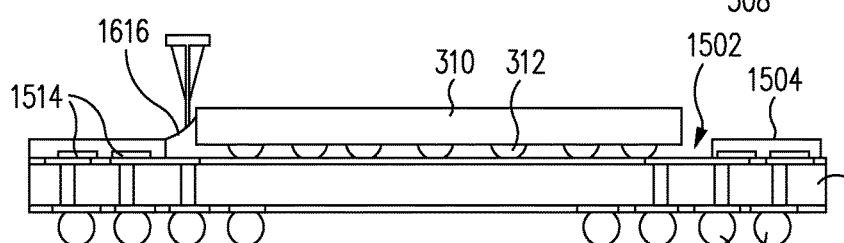
FIG. 16
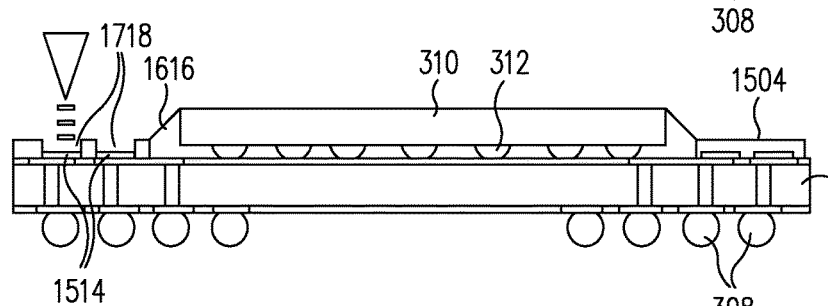
FIG. 17
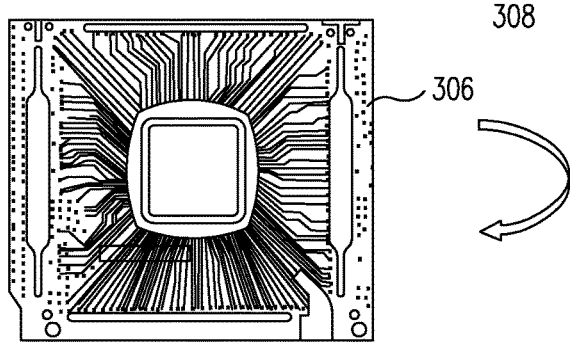
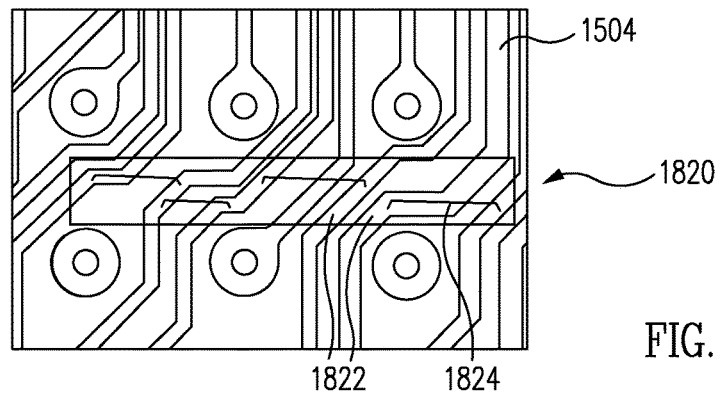
FIG. 18

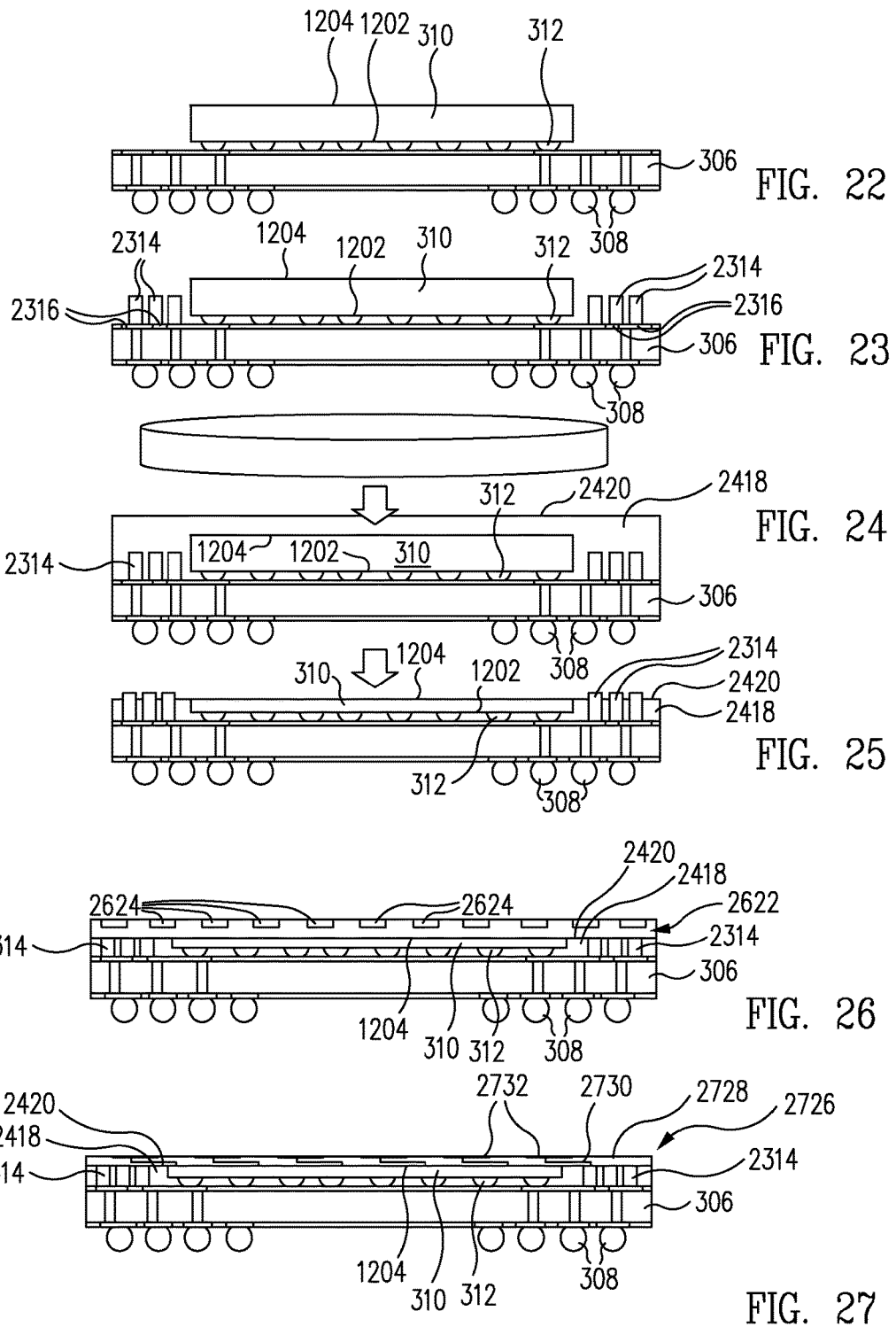

METHODS AND STRUCTURES FOR INCREASING THE ALLOWABLE DIE SIZE IN TMV PACKAGES

RELATED APPLICATION

The present application claims benefit of Nicholls et al, U.S. Provisional Application No. 61/444,306, entitled "METHODS AND STRUCTURES FOR INCREASING THE ALLOWABLE DIE SIZE IN TMV PACKAGES", filed on Feb. 18, 2011, which is herein incorporated by reference in its entirety.

TECHNICAL FIELD

The present application relates to the field of electronics, and more particularly, to methods of forming electronic component packages and related structures.

BACKGROUND

The current trend is to integrate vertically by stacking packages (3D Packaging). There are several packaging formats currently being used to accomplish this: (1) Traditional Package-on-Package (PoP) with bare die or pin gate molding; (2) Package-in-Package (PiP); and (3) Thru-Mold Via (TMV).

In each of these formats, the space needed to accommodate the vertical structures limits the space available on the bottom package for the main logic die. The challenge is to maximize the die size allowed in the bottom package while maintaining the same package-to-package I/O currently used.

Until now, the main focus has been to reduce the BGA pitch of the top package so that more I/O can fit on one or two perimeter rows which then gives more space in the middle for the die in the bottom package. One challenge to this approach is with tighter pitches on the top package, the top package BGA ball becomes smaller which affects both stand-off, and collapse.

In TMV format, there is the added challenge of "building up" the solder within the TMV package to achieve a relatively tall bump with a tight pitch.

BRIEF DESCRIPTION OF THE DRAWINGS

FIGS. 15, 16, 17 and 18 illustrate an embodiment using a ball pad opening through the solder mask by laser;

FIGS. 22, 23, 24, 25, 26, and 27 illustrate an embodiment using redistribution using an interposer or RDL structure;

In the following description, the same or similar elements are labeled with the same or similar reference numbers.

DETAILED DESCRIPTION

Figure 1:
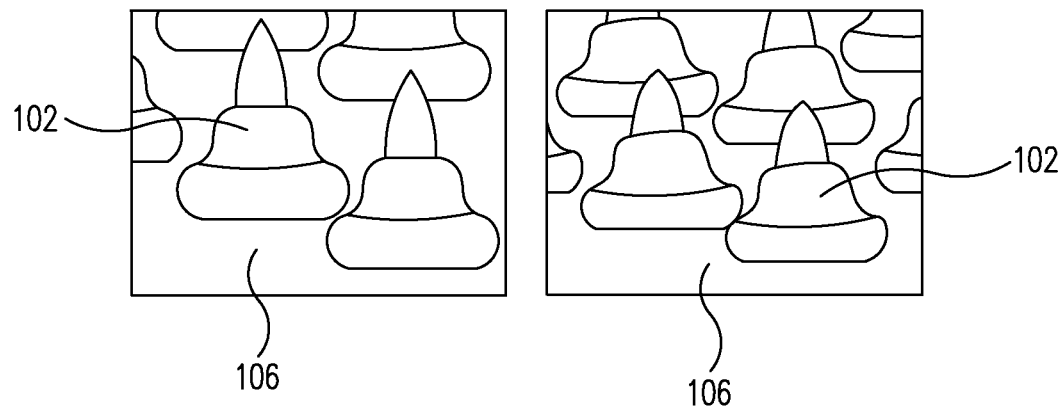
FIGS. 1 and 2 illustrate an embodiment using narrow pillars in the TMV (Thru-Mold Via)
Figure 2:
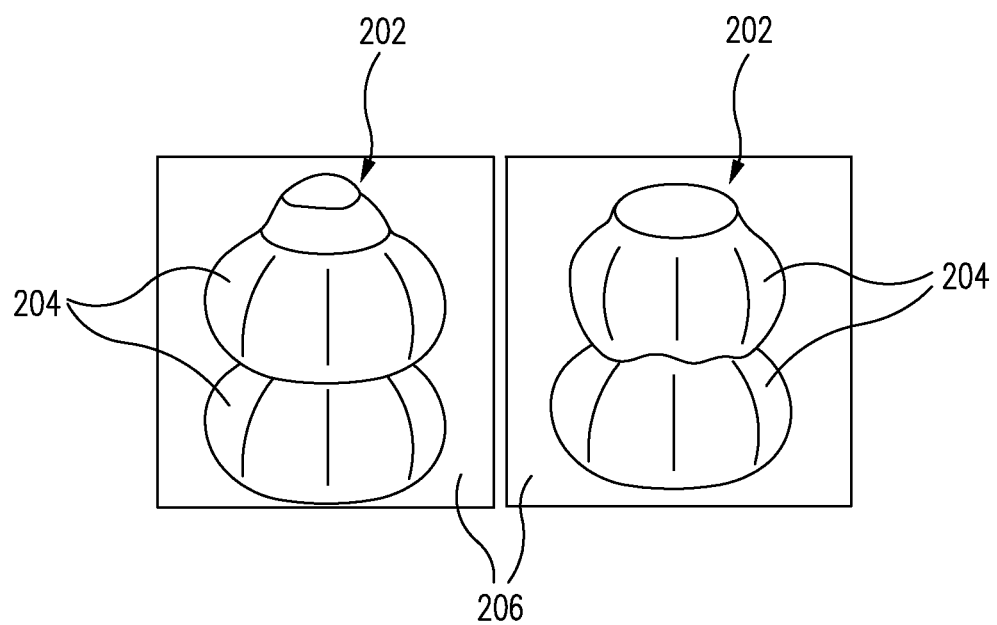

FIGS. 1 and 2 illustrate an embodiment using narrow pillars in the TMV (Thru-Mold Via). More particularly, FIG. 1 illustrates a narrow pillar 102 formed from a single long copper stud bond formed, for example, using a wire bonding apparatus. FIG. 2 illustrates a narrow pillar 202 formed from multiple copper stud bonds 204 one on top of another formed, for example, using a wire bonding apparatus.

Although two copper stud bonds 204 are illustrated as forming narrow pillar 202 in FIG. 2, in other embodiments, more than two, e.g., three, four, or more, copper stud bonds 204 are used to form a narrow pillar 202.

By using a single, long copper stud bond (narrow pillar 102), or a multiple copper stud bond (narrow pillar 202), the diameter of the bond can be reduced, for example, from 250 μm diameter to approximately 100 um diameter which would give an immediate increase of 150 um for die size.

Additionally, if the copper stud bond is done at, for example, 200° C. or below, the copper stud bonds can be formed before flip chip attach. This would allow for more flexibility for capillary underfill (CUF) bleed increasing the allowable die size.

The copper wire used to form narrow pillars 102, 202 could be pure copper or coated copper wire with a coating such as Palladium or other suitable coating.

Narrow pillars 102, 202 are formed, for example, on solder mask defined (SMD) pads of substrates 106, 206, respectively. Narrow pillars 102, 202 including the electronic components mounted to substrates 106, 206 are then enclosed within a molding compound similar to the package as shown in FIG. 3.

In one embodiment, the molding compound is laser ablated to expose narrow pillars 102, 202. As narrow pillars 102, 202, and in particular narrow pillars 202, are relatively tall, the amount of molding compound that must be removed to expose narrow pillars 102, 202 is minimized. This allows the via apertures, sometimes called TMV, formed during the laser ablation to be relatively short, i.e., to have a shallow depth, and thus to have a minimum diameter.

Figure 3:
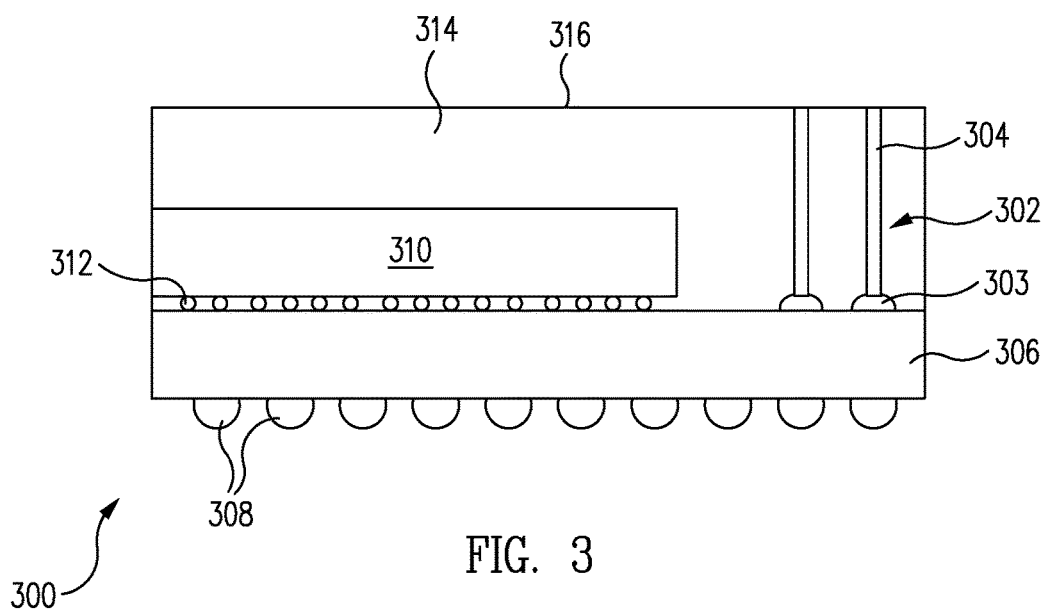
FIG. 3 illustrates another embodiment using narrow pillars in the TMV.

FIG. 3 illustrates another embodiment using narrow pillars in the TMV. More particularly, FIG. 3 illustrates a substrate 306 having interconnection balls 308, e.g., a ball grid array (BGA), on a lower surface of substrate 306. An electronic component 310, e.g., an integrated circuit die, is flip chip mounted to an upper surface of substrate 306 using flip chip bumps 312.

Similar to the embodiment discussed above regarding FIGS. 1 and 2, narrow pillars 302 are formed but using a longer wire with ball bond 303 on the substrate pad, and longer "tail" wire 304 extending most of the way, or all of the way to the top of the package 300 from ball bond 303.

With this method, it is suitable to use a relatively thick copper wire, e.g., 6 mils, and then provide a copper ball bond 303 on the substrate pad, then extend the tail of the bond straight up to the top of the package, and using the spark to assist in breaking the wire at the correct location to give the long tail wire 304.

In this embodiment, the copper wire can consist of essentially pure copper, or a coated copper wire with a suitable coating such as Palladium.

More particularly, after flip chip mounting of electronic component 310 and formation of narrow pillars 302, electronic component 310, narrow pillars 302 and the exposed upper surface of substrate 306 are enclosed within a dielectric package body 314, e.g., molding compound. Tail wires 304 of narrow pillars 302 are exposed at a principal, or top, surface 316 of package body 314.

Package 300 can be utilized with other packages and/or interposers, e.g., in a stacked arrangement.

Figure 4:
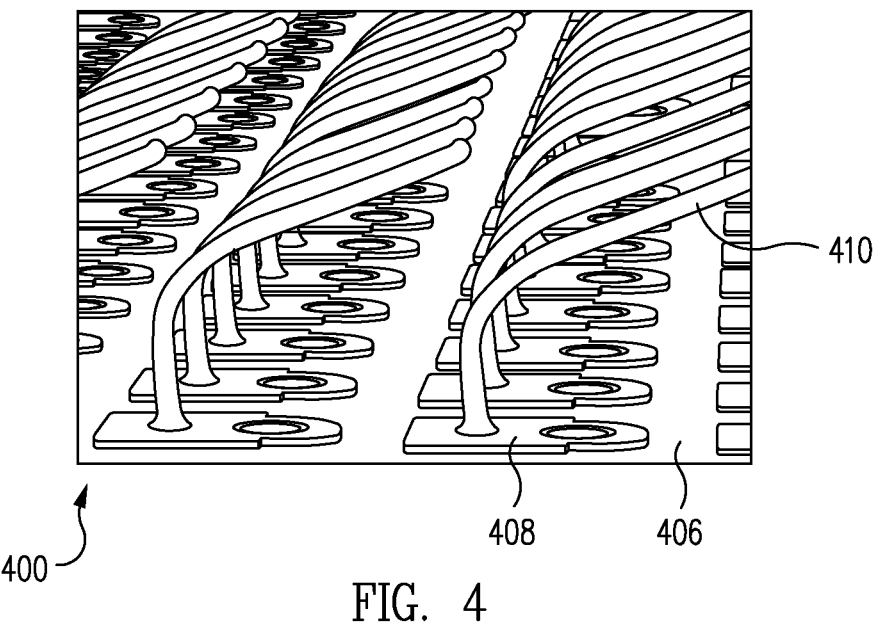
FIGS. 4 and 5 illustrate an embodiment using wire bonds to route up to BGA (Ball Grid Array) locations.
Figure 5:
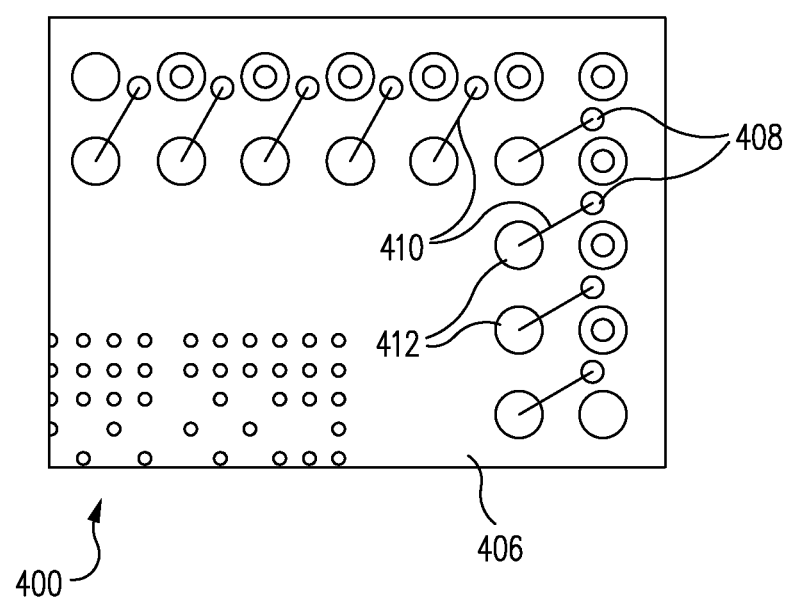

FIGS. 4 and 5 illustrate an embodiment using wire bonds to route up to BGA (Ball Grid Array) locations. The substrate bond pads 408 of a substrate 406 are moved out to the perimeter of the package 400, and then "routed" in 3D by using formed wire bonding 410, i.e., wires, to BGA locations 412, thus allowing to greatly increase the allowable die size in the TMV package 400.

By using wire bonding technology to route to a space above the die, the die cavity size is effectively increased, for example, by a minimum of 0.8 mm in both X and Y directions.

The wire used could be a gold wire, a copper wire, or a coated copper wire with a suitable coating such as Palladium.

Formed wire bonding 410, sometimes called a narrow pillar, including the electronic component mounted to substrate 406 are then enclosed within a molding compound similar to the package as shown in FIG. 3.

Figure 6:
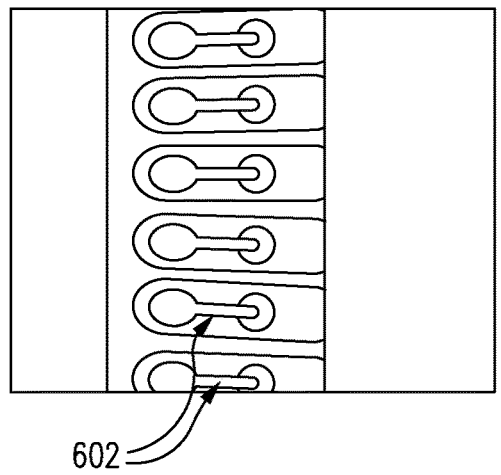
FIGS. 6, 7, and 8 illustrate an embodiment using wire bond loops as vertical connection.
Figure 7:
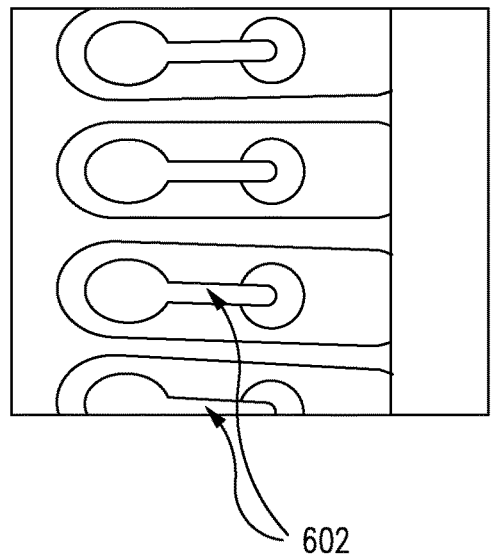
Figure 8:
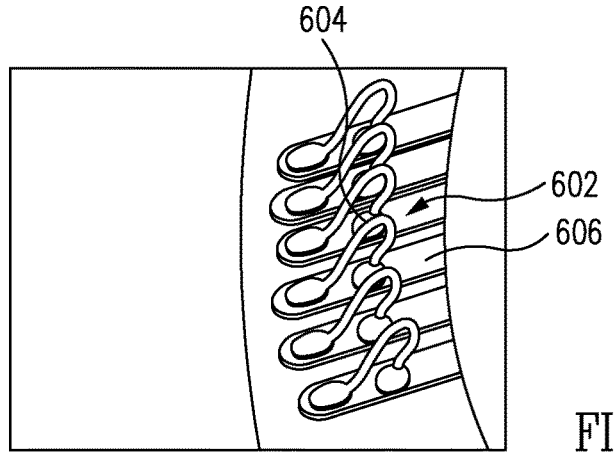

FIGS. 6, 7, and 8 illustrate an embodiment using wire bonds loops as vertical connection. An alternative method of a wire loop pad 602 includes making the loop 604 on lead fingers 606. The wire used can be gold, copper, or a coated copper wire with a suitable coating such as Palladium. Loop 604 is sometimes called a narrow pillar.

Figure 9:
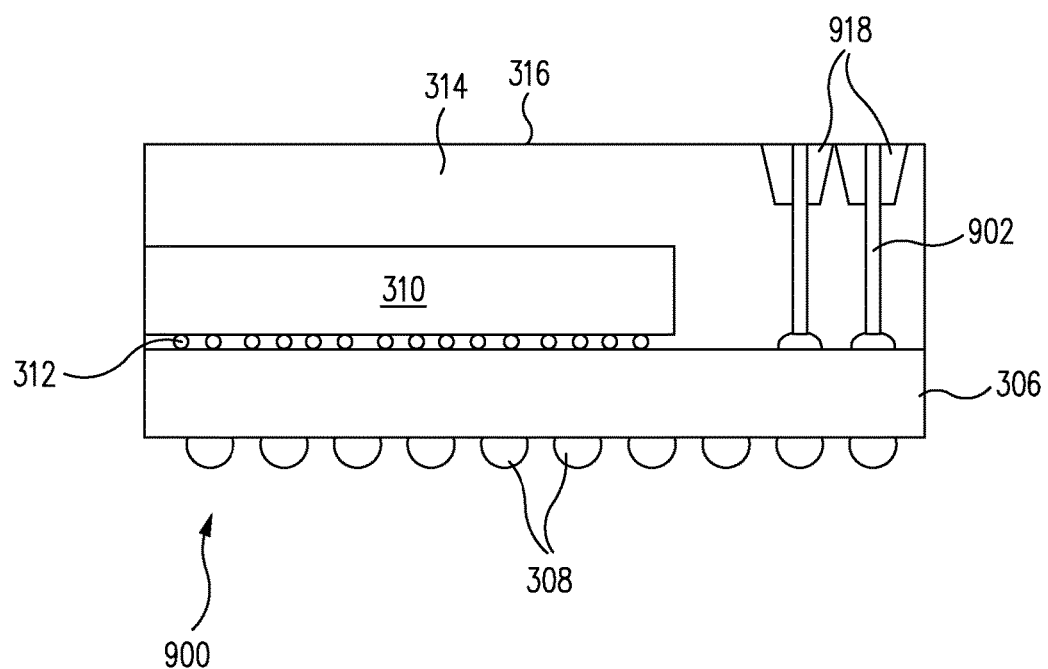
FIG. 9 illustrates an embodiment using laser ablation.

FIG. 9 illustrates an embodiment using laser ablation. For the above embodiments, e.g., those shown in FIGS. 1-8, a laser may be used to ablate the epoxy mold compound, e.g., package body 314, to form via apertures 918 in order to expose the top portion of the wire or conductor 902, e.g., a narrow pillar as described above. This allows for an upper package to be aligned and soldered to the lower package 900 by aligning the solder pads of the upper package with the exposed conductors 902 of the lower package 900 and performing a solder reflow operation.

Although conductors 902 are illustrated in FIG. 9 as being exposed through laser ablated via apertures 918, in other embodiments, narrow pillars 102, 202, 302 of FIGS. 1-3, formed wire bonding 410 of FIGS. 4-5, and/or loops 604 of FIGS. 6-8 are exposed through via apertures 918 in a similar manner.

Figure 10:
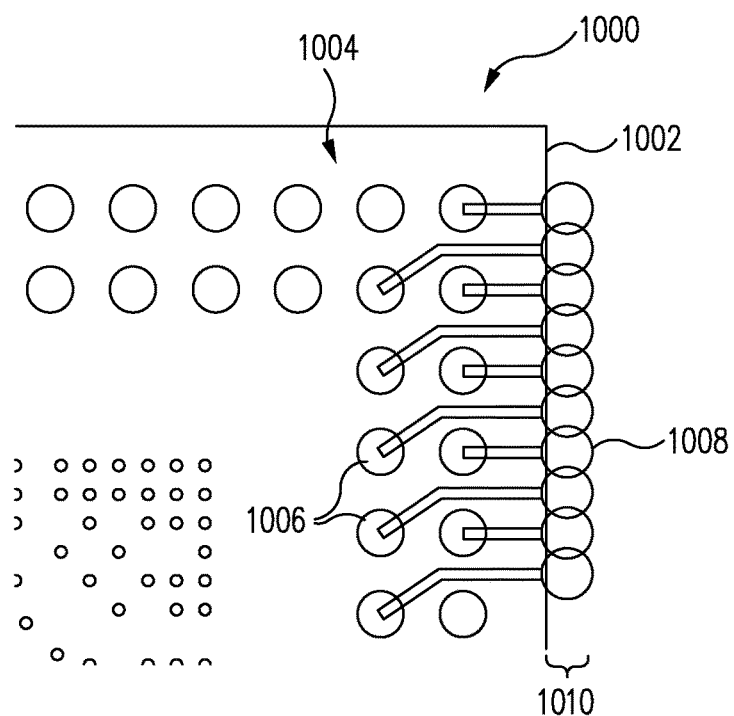
FIGS. 10 and 11 illustrate an embodiment using routing around the edge of the package.
Figure 11:
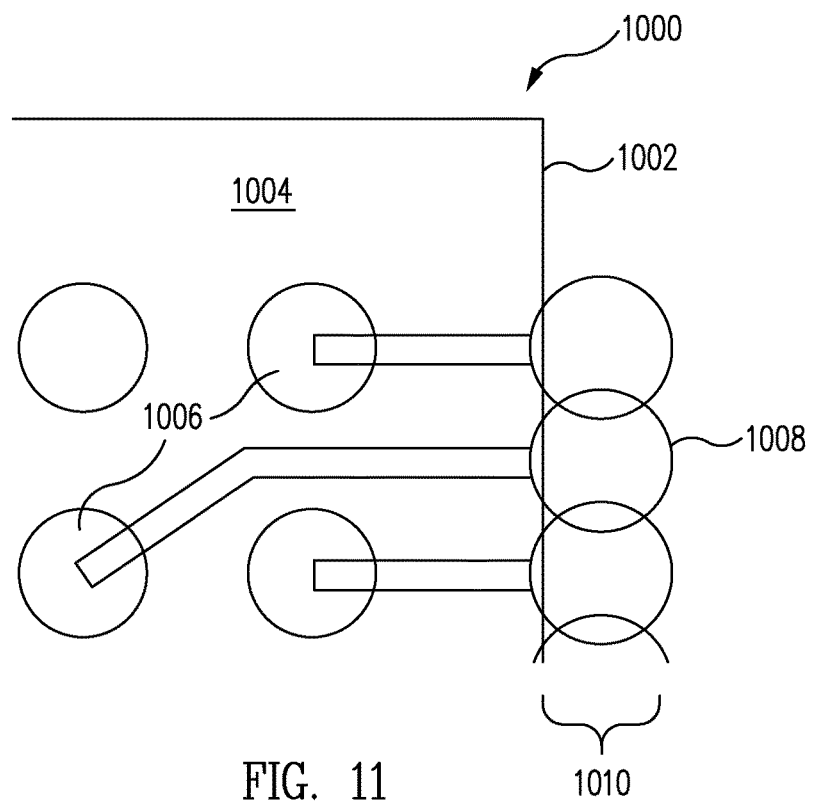

FIGS. 10 and 11 illustrate an embodiment using routing around the edge of the package. By routing around the edge 1002 and along the top 1004 of the package 1000 to the top package BGA location 1006, the allowable die size has a maximum increase.

This embodiment utilizes laser ablation or mechanical drilling and metallization techniques to form the interconnect from a pad on the substrate, along the edge 1002 of the package 1000, and along the top 1004 of the package 1000 to the BGA location 1006.

More particularly, laser ablated or drilled vias 1008 are formed in a saw street 1010 such that the edges of the vias 1008 extend slightly into the edge 1002 of the package 1000. Vias 1008 are filled with an electrically conductive material to form conductors along the edge 1002 of package 1000. Further, conductors are formed along the top 1004 of package 1000, and these conductors are connected to the conductors along the edge 1002 of package 1000. The array of packages 1000 is then singulated along saw streets 1010 to provide discrete routing (conductors) along the edge 1002 and top 1004 of package 1000.

Figure 12:
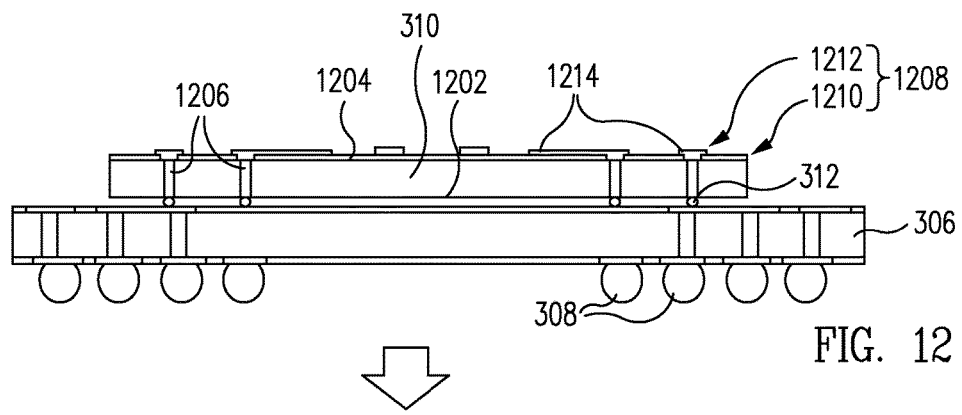
FIGS. 12, 13, and 14 illustrate an embodiment using a TSV (Thru-Silicon Via) version of TMV.
Figure 13:
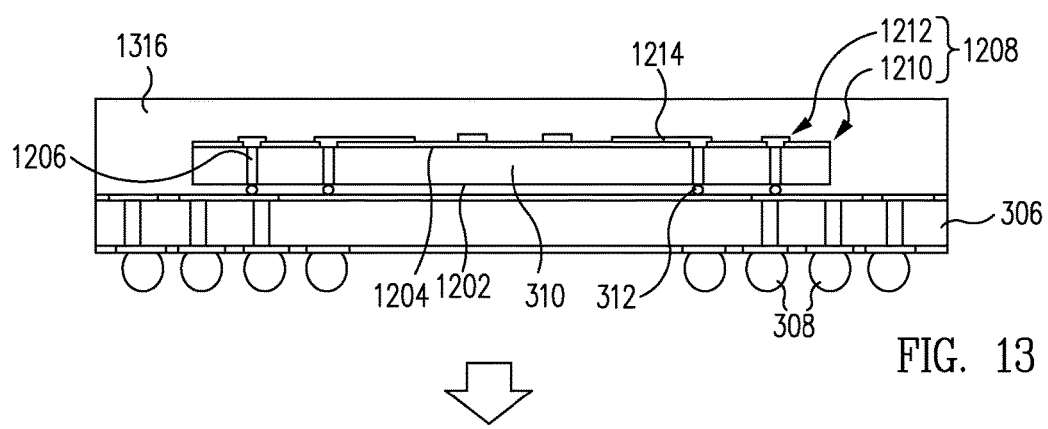
Figure 14:
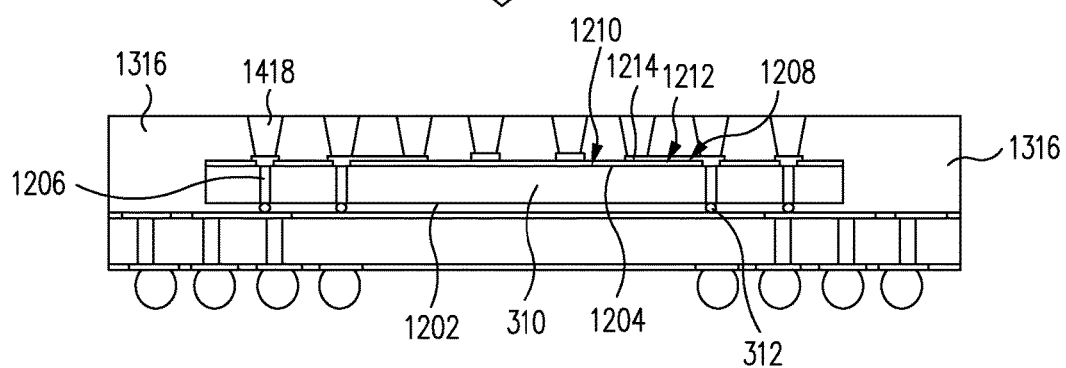

FIGS. 12, 13, and 14 illustrate an embodiment using a TSV (Thru-Silicon Via) version of TMV. The embodiment includes TSV on the bottom die, RDL (ReDistribution Layer) for the die backside metallization, and laser ablating through the mold to expose the RDL pads on the backside of the die.

More particularly, paying particular attention to FIG. 12, electronic component 310 includes an active surface 1202 and an opposite inactive surface 1204. Active surface 1202 includes the active circuitry of electronic component 310 and also includes bond pads, sometime called the Input/Output (I/O) pads of electronic component 310.

Thru-Silicon Vias (TSVs) 1206, e.g., electrically conductive columns, extend through electronic component 310 between active surface 1202 and inactive surface 1204. TSVs 1206 and the bond pads at active surface 1202 are electrically and physically connected to substrate 306 by flip chip bumps 312, e.g., solder bumps.

In one embodiment, a ReDistribution Layer (RDL) structure 1208 is formed on inactive surface 1204 of electronic component 310. RDL structure 1208 includes a dielectric passivation layer 1210 on inactive surface 1204 that is patterned to expose TSVs 1206 at inactive surface 1204. RDL structure 1208 further includes an electrically conductive circuit pattern 1212, sometimes called an RDL, formed on passivation layer 1210 and electrically connected to TSVs 1206 through the openings in passivation layer 1210. Illustratively, circuit pattern 1212 is formed by plating and etching an electrically conductive material such as copper although is formed using other techniques in other embodiments.

Circuit pattern 1212 redistributes the pattern of TSVs 1206 at inactive surface 1204 to the pattern of inactive surface RDL lands 1214 of circuit pattern 1212. Although a single passivation layer 1210 and circuit pattern 1212 are discussed above and illustrated, in other embodiments, RDL structure 1208 includes multiple dielectric layers and/or multiple circuit patterns that redistributes the pattern of TSVs 1206 at inactive surface 1204 to the pattern of inactive surface RDL lands 1214.

Referring now to FIG. 13, electronic component 310 including RDL structure 1208 and the exposed portion of the upper surface of substrate 306 are enclosed in a dielectric package body 1316, e.g., molding compound.

Referring now to FIG. 14, via apertures 1418, sometimes called TMV, are formed in package body 1316 to expose inactive surface RDL lands 1214. By using inactive surface 1204 to distribute inactive surface RDL lands 1214, the allowable size of electronic component 310 is maximized.

FIGS. 15, 16, 17 and 18 illustrate an embodiment using a ball pad opening through the solder mask by a laser. In accordance with this embodiment, the solder mask is left over the bond pads to act as an UF (Under Fill) dam and ball pad openings are formed by laser.

More particularly, referring to FIG. 15, an opening 1502 is formed in a solder mask 1504 on or part of the upper surface of substrate 306. Electronic component 310 is flip chip mounted to substrate 306 in opening 1502, e.g., with flip chip bumps 312. Pads 1514 of substrate 306 remain covered and protected by solder mask 1504, sometimes called a pad protectant layer. Pads 1514 are outward of electronic component 310.

Referring now to FIG. 16, a dielectric underfill 1616 is applied between electronic component 310 and substrate 306 and around flip chip bumps 312. In one embodiment, underfill 1616 bleeds out above pads 1514. However, pads 1514 are covered and protected by solder mask 1504. As there is no risk of resin bleed out (RBO), i.e., there is no risk of contamination of pads 1514 (sometimes called ball pads) by underfill 1616, the die size is maximized.

Referring now to FIG. 17, solder mask 1504 is laser ablated to form solder mask openings 1718 therein. Solder mask openings 1718 expose pads 1514 for electric connection thereto by other structures.

Referring now to FIG. 18, in another embodiment, a solder mask opening 1820 is formed in solder mask 1504 to expose traces 1822 on or embedded within the upper surface of substrate 306. The exposed traces 1822 are electrically connected together with wires 1824, for example, to provide a pad to pad bond.

Figure 19:
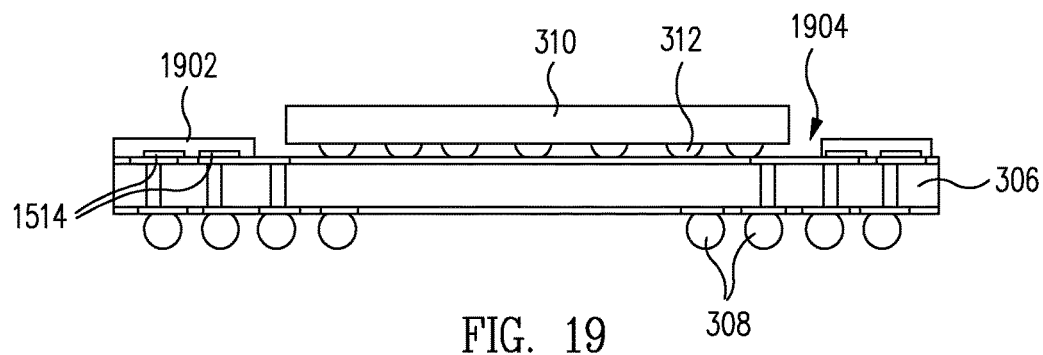
FIGS. 19, 20, 21 illustrate an embodiment using a ball pad opening covered with a film.
Figure 20:
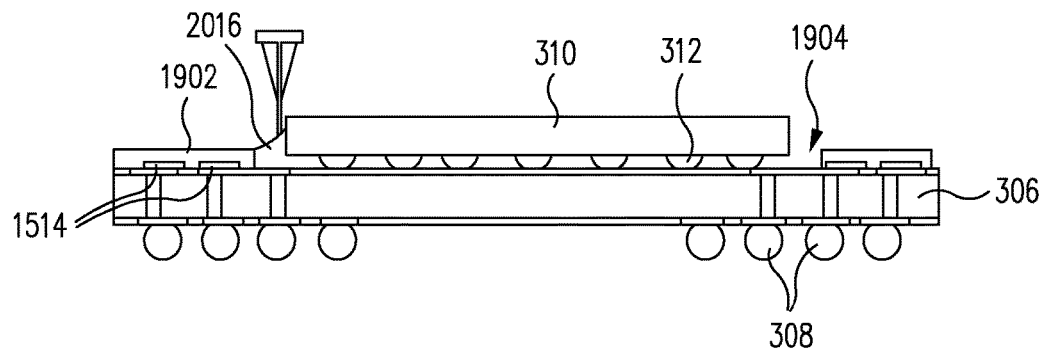
Figure 21:
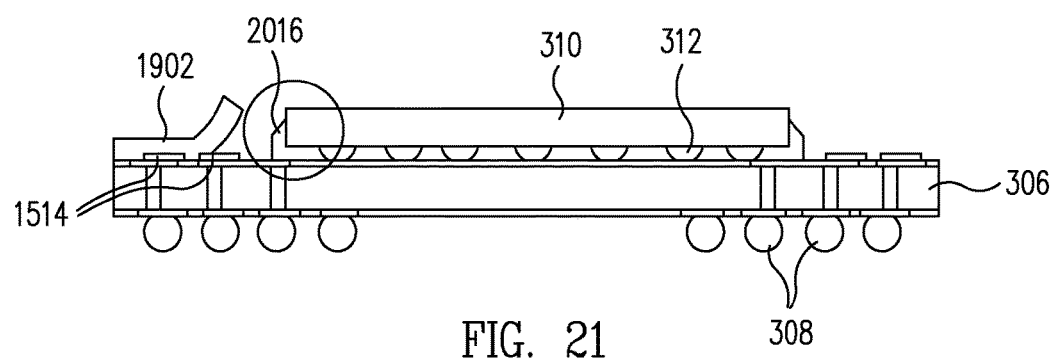

FIGS. 19, 20, 21 illustrate an embodiment using a ball pad opening covered with a film. More particularly, referring to FIG. 19, pads 1514 are covered and protected by a removable film 1902, e.g., a UV film. Removable film 1902 has a removable film opening 1904 therein. Removable film 1902 is sometimes called a pad protectant layer.

Electronic component 310 is flip chip mounted to substrate 306, e.g., with flip chip bumps 312, and within removable film opening 1904. Pads 1514 of substrate 306 remain covered and protected by removable film 1902.

Referring now to FIG. 20, a dielectric underfill 2016 is applied between electronic component 310 and substrate 306 and around flip chip bumps 312. In one embodiment, underfill 2016 bleeds out above pads 1514. However, pads 1514 are covered and protected by removable film 1902. As there is no risk of resin bleed out (RBO), i.e., there is no risk of contamination of pads 1514 (sometimes called ball pads) by underfill 2016, the die size is maximized. In one embodiment, underfill 2016 is cured after application.

Referring now to FIG. 21, removable film 1902 is removed, sometimes called stripped, to expose pads 1514 for electric connection thereto by other structures.

As set forth above, the ball pad opening that exposes pad 1514 is covered by removable film 1902. Further, removable film 1902 is peeled off after cure of underfill 2016. There is no risk of RBO, the die size is maximized, and there is no risk of contamination on the ball pad 1514.

FIGS. 22, 23, 24, 25, 26, and 27 illustrate an embodiment using redistribution using an interposer or RDL structure. In accordance with one embodiment, a stud or post is applied for the vertical connection. After molding, a grind down is performed to expose the post. An interposer or RDL structure is applied which fans I/O (Input/Output) from the perimeter.

More particularly, referring to FIG. 22, electronic component 310 is flip chip mounted to the upper surface of substrate 306 with flip chip bumps 312.

Referring now to FIG. 23, metallic studs 2314, sometimes called posts, are formed, for example, by plating, on pads 2316 on the upper surface of substrate 306. Pads 2316 are outward of electronic component 310, i.e., electronic component 310 is inward of pads 2316.

As shown in FIG. 24, electronic component 310, studs 2314, and the exposed upper surface of substrate 306 are enclosed in a dielectric package body 2418, e.g., molding compound. Package body 2418 and, optionally, inactive surface 1204 of electronic component 310, are then ground down from a principal surface 2420 of package body 2418 to expose studs 2314 as illustrated in FIG. 25. Although studs 2314 are illustrated as protruding above principal surface 2420 in FIG. 25, in another embodiment, studs 2314 are flush with principal surface 2420.

As illustrated in FIG. 26, an interposer 2622, e.g., a silicon, laminate, or other type of discrete interposer, is mounted to principal surface 2420 of package body 2418 and to inactive surface 1204 of electronic component 310. Interposer 2622 is electrically coupled to exposed studs 2314.

Interposer 2622 redistributes the pattern of studs 2314 to a pattern of outer interposer pads 2624. As illustrated, at least some of outer interposer pads 2624 are located directly above electronic component 310. By fanning in the pattern of studs 2314 above the area of electronic component 310, the allowable size of electronic component 310 is maximized.

FIG. 27 illustrates another embodiment of the package of FIG. 25 at a later stage during fabrication and including a RDL structure 2726. In one embodiment, RDL structure 2726 is formed on inactive surface 1204 of electronic component 310 and principal surface 2420 of package body 2418. RDL structure 2726 includes a dielectric passivation layer 2728 on inactive surface 1204 and principal surface 2420 that is patterned to expose studs 2314.

RDL structure 2726 further includes an electrically conductive circuit pattern 2730, sometimes called an RDL, formed on passivation layer 2728 and electrically connected to studs 2314. Illustratively, circuit pattern 2730 is formed by plating and etching an electrically conductive material such as copper although is formed using other techniques in other embodiments.

Circuit pattern 2730 redistributes the pattern of studs 2314 to the pattern of inactive surface RDL lands 2732 of circuit pattern 2730. Although a single passivation layer 2728 and circuit pattern 2730 are discussed above and illustrated, in other embodiments, RDL structure 2726 includes multiple dielectric layers and/or multiple circuit patterns that redistribute the pattern of studs 2314 to the pattern of inactive surface RDL lands 2732.

As illustrated, at least some of inactive surface RDL lands 2732 are located directly above electronic component 310. By fanning in the pattern of studs 2314 above the area of electronic component 310, the allowable size of electronic component 310 is maximized.

Figure 28:
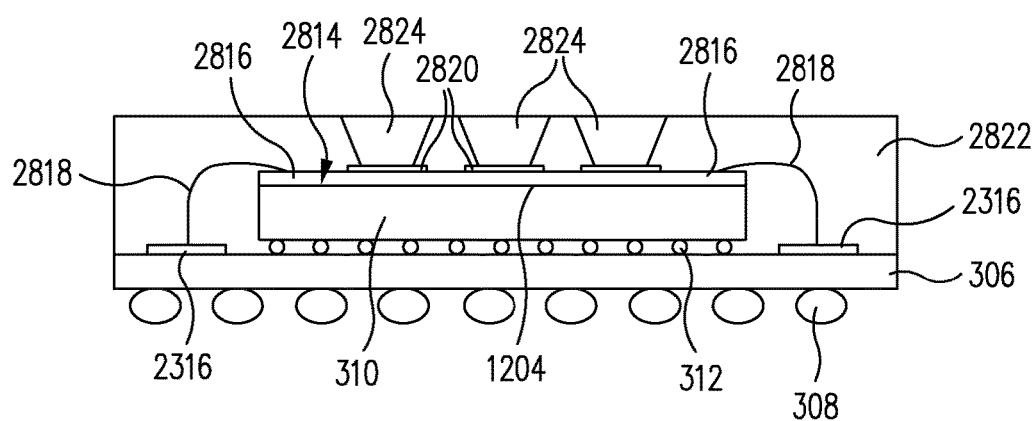
FIG. 28 illustrates an embodiment using a wire bonded interposer with a TMV connection.

FIG. 28 illustrates an embodiment using a wire bonded interposer with a TMV connection. In accordance with this embodiment, an interposer is applied to the backside of the die, connections are wire bonded to the interposer, and openings are laser ablated to expose the interposer pads.

More particularly, electronic component 310 is flip chip mounted to substrate 306 with flip chip bumps 312. An interposer 2814, e.g., a silicon, laminate, or other type of discrete interposer, is mounted, e.g., with solder, adhesive, or otherwise bonded, to inactive surface 1204 of electronic component 310. Interposer lands 2816 of interposer 2814, e.g., around the outer periphery of interposer 2814, are electrically coupled to pads 2316 of substrate 306 with electrically conductive bond wires 2818.

Interposer 2814 and bond wires 2818 redistributes the pattern of pads 2316 of substrate 306 to a pattern of outer interposer pads 2820 of interposer 2814. As illustrated, outer interposer pads 2820 are located directly above electronic component 310.

Electronic component 310, interposer 2814, bond wires 2818, and the exposed portion of the upper surface of substrate 306 are enclosed in a dielectric package body 2822, e.g., molding compound.

Via apertures 2824, sometimes called TMV, are formed in package body 2822 to expose outer interposer pads 2820. By forming outer interposer pads 2820 above inactive surface 1204, the allowable size of electronic component 310 is maximized.

Referring now to FIGS. 14 and 28 together, in another embodiment, interposer 2814 of FIG. 28 is used to redistribute the pattern of TSVs 1206 (FIG. 14) to the pattern of outer interposer pads 2820 (FIG. 28). Stated another way, the package as illustrated in FIG. 14 is formed with interposer 2814 of FIG. 28 instead of RDL structure 1208 of FIG. 14.

In yet another embodiment, referring still to FIGS. 14 and 28 together, RDL structure 1208 of FIG. 14 and bond wires 2818 (FIG. 28) are used to redistribute the pattern of pads 2316 of substrate 306 (FIG. 28) to the pattern of inactive surface RDL lands 1214 (FIG. 14). Stated another way, the package as illustrated in FIG. 28 is formed with RDL structure 1208 of FIG. 14 instead of interposer 2814 of FIG. 28.

Figure 29:
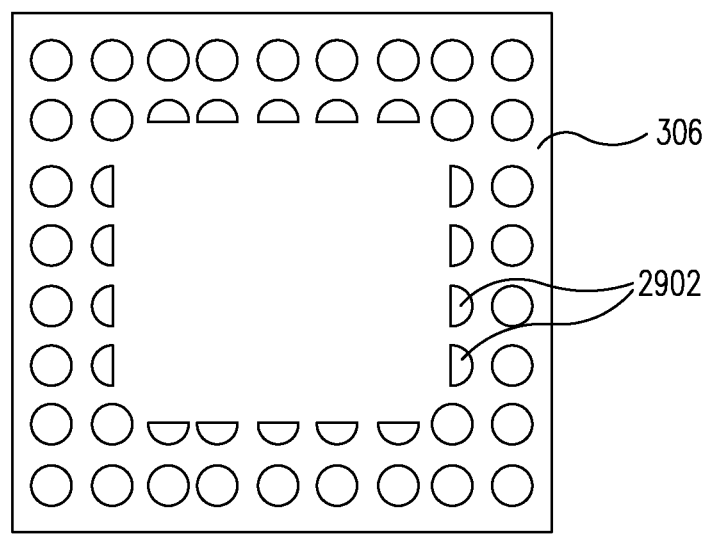
FIG. 29 illustrates an embodiment using specially shaped pads to increase the distance between the die edge and the TMV pads.

FIG. 29 illustrates an embodiment using specially shaped pads to increase the distance between the die edge and the TMV pads. In accordance with this embodiment, a special shaped TMV pad 2902 is applied to maximize the distance from the die edge to the TMV pad without adversely affecting the location of the TMV ball. A "D" shaped pad 2902 is an example of one embodiment. In one embodiment, all of the pads of substrate 306 are D shaped pads 2902, for example, to provide consistent height of solder reflowed on the pads of substrate 306.

Further, although D shaped pads 2902 are illustrated, in other embodiments, pads 2902 have other shapes, e.g., C shape.

The various packages as described herein are used in a variety of applications. For example, the packages can be stacked, e.g., can be a lower package with another package or structure stacked on top or can be the upper package stacked upon a lower package or structure. Further, additional interposers can be mounted to the packages or the packages can be mounted to interposers. Although specific applications are discussed here, in light of this disclosure, those of skill in the art will understand that the packages can be used in other applications.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A package comprising:
a substrate comprising a surface comprising pads thereon;
an electronic component flip chip mounted to the surface of the substrate inward of the pads;
an interposer having an interposer side coupled to an inactive surface of the electronic component, the interposer comprising:
interposer lands; and
outer interposer pads;
bond wires coupling the pads of the substrate to the interposer lands; and
a package body comprising ablated via apertures;
wherein an area of the interposer side is equal to an area of the inactive surface of the electronic component.

2. The package of claim 1 wherein the interposer lands are located around the outer periphery of the interposer.

3. The package of claim 1 wherein the interposer and the bond wires redistribute the pattern of the pads of the substrate to a pattern of the outer interposer pads.

4. The package of claim 1 wherein the outer interposer pads are located directly above the electronic component.

5. The package of claim 1 wherein the package body encloses the electronic component, the interposer, and the bond wires.

6. The package of claim 1 wherein one or more of the pads of the substrate are "D" shaped.

7. A package comprising:
a substrate comprising a pad;
an electronic component coupled to the substrate and laterally offset from the pad;
a pillar coupled to the pad, the pillar comprising a wire extending from the pad to a location directly above the pad; and
a package body enclosing the pillar and the electronic component,
wherein the wire protrudes from the package body directly above the pad.

8. The package of claim 7, wherein the wire is bent.

9. A package comprising:
a substrate comprising a plurality of pads, first interconnection structures on a first side of the substrate, and second interconnection structures on a second side of the substrate opposite the first side of the substrate;
an electronic component flip chip mounted to the first side of the substrate and laterally offset from the plurality of pads of the substrate;
a plurality of electrically conductive vertical structures, each of the vertical structures comprising a wire extending from and wire-bonded to a respective one of the plurality of pads of the substrate; and
a package body enclosing the electronic component and the vertical structures,
wherein the vertical structures extend to at least a principal surface of the package body.

10. The package of claim 9, wherein each of the vertical structures protrudes from the package body.

11. The package of claim 10, wherein each of the vertical structures comprises a bend.

12. The package of claim 9, wherein the respective wire of each of the vertical structures protrudes from the package body at a respective location directly above the respective one of the plurality of pads from which the respective wire extends.

13. A package comprising:
a substrate comprising a pad on a first surface of the substrate;
an electronic component flip chip mounted to the first surface of the substrate and laterally offset from the pad;
a pillar coupled to the pad, the pillar comprising a wire extending from the pad;
a package body enclosing the pillar and the electronic component; and
an underfill between at least a center portion of the electronic component and the substrate,
wherein the wire protrudes from the package body at a location directly above the pad.

14. The package of claim 1, wherein the ablated vias expose the outer interposer pads externally to the package.

15. The package of claim 1, wherein the ablated vias widen from a minimum width at the outer interposer pads to a maximum width at a top surface of the package body.

16. The package of claim 7, wherein:

the package body comprises a principal surface facing away from the substrate; and the wire protrudes from the principal surface.

17. The package of claim 7, wherein:

the package body comprises a principal surface facing upward and away from the substrate and at a first distance from the substrate; and the wire exits upward from the package body at a second distance from the substrate different from the first distance.

18. The package of claim 17, wherein the second distance is less than the first distance.

19. The package of claim 7, wherein:

the wire comprises:

a wire bond coupled to the pad of the substrate; and a wire tail extending from the wire bond and protruding from the package body.

20. The package of claim 7, comprising underfill, different from the package body, between at least a center portion of the electronic component and the substrate, wherein the underfill surrounds flip chip bumps below the electronic component but does not surround the wire.

21. The package of claim 7, wherein:

the electronic component is coupled to a first side of the substrate; and a second side of the substrate opposite the first side of the substrate comprises electrical interconnection structures.

\* \* \* \* \*